United States Patent [19]
Park et al.

[11] Patent Number: 5,654,664
[45] Date of Patent: Aug. 5, 1997

[54] INPUT BUFFER CIRCUIT FOR A SEMICONDUCTOR MEMORY

[75] Inventors: Jong-Hoon Park, Kyungki-do; Jae-Woon Kim, Seoul, both of Rep. of Korea

[73] Assignee: LG Semicon Co., Ltd., Cheongju, Rep. of Korea

[21] Appl. No.: 623,083

[22] Filed: Mar. 28, 1996

[30]  Foreign Application Priority Data

Jul. 22, 1995 [KR]  Rep. of Korea ............... 21767/1995

[51] Int. Cl.$^6$ ........................................... H01J 19/82
[52] U.S. Cl. .................. 327/531; 327/307; 327/319; 326/71; 326/81
[58] Field of Search ........................ 327/307, 319, 327/531; 326/71, 81

[56]  References Cited

U.S. PATENT DOCUMENTS 5,534,801  7/1996  Wu et al. ..................... 326/81
5,589,783  12/1996  McClure ....................... 326/81

OTHER PUBLICATIONS

IBM Tech. Disc. Bul. "Current Mode Level Shifter and Off Chip Receiver" vol. 37 No. 11 Nov. 1994.

*Primary Examiner*—Margaret Rose Wambach
*Attorney, Agent, or Firm*—Fleshner & Kim

[57]  ABSTRACT

An input buffer circuit of a semiconductor memory capable of controlling a logic threshold voltage of the circuit according to a change in an external supply voltage, which includes an external supply voltage detecting unit for dividing the external supply voltage into a plurality of regions by comparing a plurality of voltages, which have been divided by different ratios of the entire external supply voltage, with a standard voltage; and a converting unit including a pull-up circuit and a pull-down circuit, for converting input signals of TTL level into signals of CMOS level, according to the regions of the external supply voltage obtained by the external supply voltage detecting unit. The input buffer has an advantage in that margins for a logical high input range and logical low input range are improved when converting voltages of TTL level into voltages of CMOS level, by controlling the logic threshold voltage so as to lower the logic threshold voltage when the external supply voltage level is high and raise the logic threshold voltage when the external supply voltage level is low.

17 Claims, 6 Drawing Sheets

INPUT BUFFER CIRCUIT FOR A SEMICONDUCTOR MEMORY

BACKGROUND OF THE INVENTION

1. Field of the Invention

The present invention relates to an input buffer circuit for a semiconductor memory, and particularly to an input buffer circuit of a semiconductor memory capable of controlling a logic threshold voltage of the circuit according to a change in an external voltage.

2. Description of the Conventional Art

An input buffer circuit, directed to changing an externally inputted voltage of TTL level into a voltage of CMOS level, generally includes NOR gates, NAND gates, or inverters. Further, the input buffer circuit is enabled by a chip selection signal CS determining an operation of the circuit, and outputs a signal Buffer Output of CMOS level by converting an input signal Buffer Input of TTL level.

Referring to FIG. 1, the conventional input buffer circuit includes PMOS transistors 11 and 12, and an NMOS transistor 13 connected in series between an external voltage Vcc and ground; an NMOS transistor 14 having its source grounded, and its drain connected to a common connecting point between the PMOS transistor 12 and the NMOS transistor 13 via a node N1; series inverters 15 and 16 for successively inverting the electric potential at the node N1, successively; and an inverter 17 for inverting the inputted chip selection signal CS and applying the inverted signal to the respective gates of the PMOS transistor 12 and the NMOS transistor 14. Here, the input signal Buffer Input, that is, the voltage of TTL level is applied to the gates of the PMOS transistor 11 and the NMOS transistor 13.

The operation of the conventional input buffer circuit having the above-described structure will be explained as follows. First, when the chip selection signal CS of low level is inputted, the inverter 17 inverts this signal to a high level and applies the inverted signal to the gates of the NMOS transistor 14 and the PMOS transistor 12, thereby causing the NMOS transistor 14 to be turned on and the PMOS transistor 12 to be turned off. Accordingly, the electric potential at the node N1 due to the NMOS transistor 14 which is turned on becomes low, regardless of the level of the input signal Buffer Input.

On the other hand, when a chip selection signal of high level is inputted, the inverter 17 inverts this signal to a low level and applies the inverted signal to the gates of the NMOS transistor 14 and the PMOS transistor 12, thereby causing the NMOS transistor 14 to be turned off and the PMOS transistor 12 to be turned on. Therefore, the level of the electric potential at the node N1 is decided by the input signal. Assuming that the input signal is low, the PMOS transistor 11 is turned on and the NMOS transistor 13 is turned off, and thereby the electric potential at the node N1 becomes high by the PMOS transistors 11 and 12 which are turned on. Consequently, as the electric potential at node N1 is inverted successively by the inverters 15 and 16, the output signal is high. However, when the input signal is high, the PMOS transistor 11 is turned off and the NMOS transistor 13 is turned on, and thereby the electric potential at node N1 becomes low. Since this electric potential of low level is inverted by the inverters 15 and 16, successively, the output signal becomes low. Accordingly, when the chip selection signal is high, assuming that the input signal is low, the output signal becomes high. On the other hand, assuming the input signal is high, the output signal becomes a low level.

FIG. 2 is a timing diagram showing the above-described operation. As shown in FIG. 2, when the chip selection signal CS is low, the output signal Buffer Output is always low, regardless of the level of the input signal Buffer Input. However, in the case that the chip selection signal is high, when the input signal is high, the output signal becomes low. On the other hand, when the input signal is low, the output signal becomes high.

FIG. 3 is a diagram showing the relationships between the input signal Buffer Input, that is, the voltage $V_{BI}$ of TTL level and the output signal Buffer Output, that is, the voltage $V_{N1}$ of CMOS level at node N1, in accordance with the change of the external supply voltage Vcc, in the conventional circuit of FIG. 1. Here, crossing points between the plots showing the external voltage Vcc and $V_{BI}$ are logic threshold voltages of the input buffer circuit at each external supply voltage Vcc level. When the external supply voltage is 2.6 V, the logic threshold voltage bemomes above 1 V. When the input signal is above 1 V, it is recognized as a high level, and thereby the output signal of the input buffer circuit becomes low. On the other hand, when the input signal is below 1 V, it is recognized as a low level, and thereby the output signal of the input buffer circuit becomes high. Further, when the external supply voltages are 3.3 V or 4.0 V, the logic threshold voltages become about 1.3 V or 1.8 V, respectively. When the input signals are above the logic threshold voltages, they are recognized as signals of high level, and thereby the output signals of the input buffer circuit become low. On the other hand, when the input signals are below the logic threshold voltages, they are regarded as signals of low level, and thereby the output signals of the input buffer circuit become high.

Accordingly, in the conventional input buffer circuit, there is a problem in that as the level of the external supply voltage increases, the logic threshold voltage of the circuit also increases, and on the other hand, as the level of the external supply voltage decreases, the logic threshold voltage also decreases.

SUMMARY OF THE INVENTION

Therefore, it is an object of the present invention to provide an input buffer circuit for a semiconductor memory which is capable of reducing a logic threshold voltage of the circuit when the level of an external supply voltage is high, and raising the logic threshold voltage of the circuit when the level of the external supply voltage is low.

To achieve the above-mentioned object, the input buffer circuit according to the present invention includes an external supply voltage detecting unit for dividing levels of the external supply voltage into a plurality of regions by comparing a plurality of voltages which have been divided into different ratios of the entire external supply voltage, with a standard voltage; and converting means including a pull-up means and a pull-down means, for converting input signals of TTL level into signals of CMOS level, according to the regions of the external supply voltage obtained by the external supply voltage detecting unit.

The input buffer circuit according to the present invention having the above-described structure raises a logic threshold voltage of the circuit by relatively increasing the value of the pull-up means when the external supply voltage level is low, and, on the other hand, reduces the logic threshold voltage of the circuit by relatively increasing the value of the pull-down means when the external supply voltage level is high.

BRIEF DESCRIPTION OF DRAWINGS

The above object and advantages of the present invention will be more clearly understood from the following detailed description taken in conjunction with the accompanying drawings, in which.

DETAILED DESCRIPTION OF THE PREFERRED EMBODIMENTS

Figure 4:
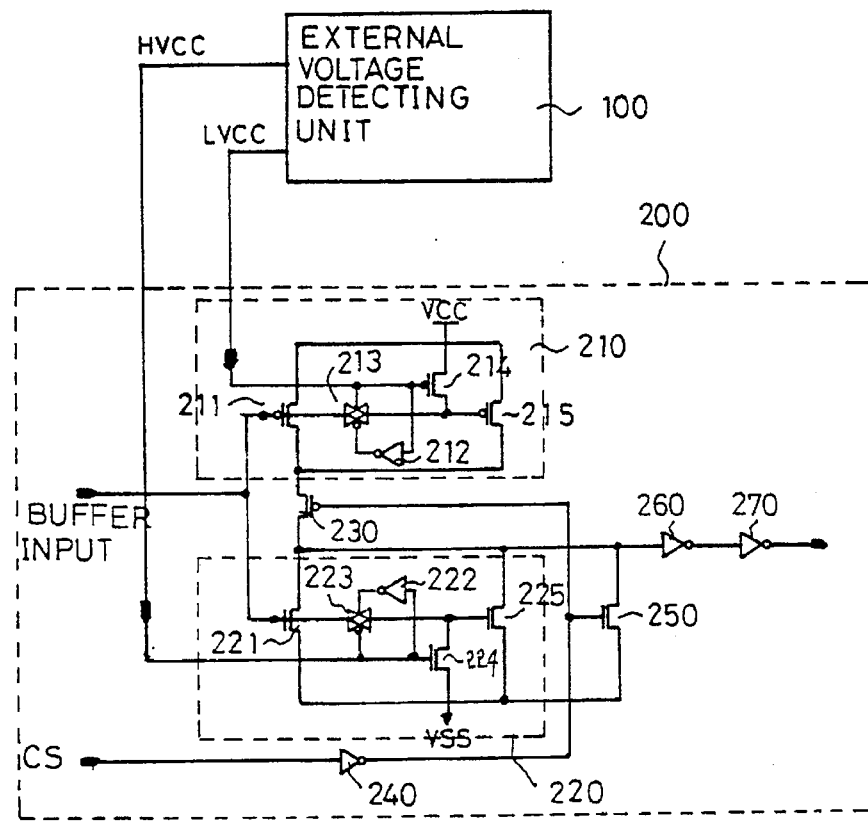
FIG. 4 is a schematic block diagram showing a first embodiment of an input buffer circuit according to the present invention.

Referring to FIG. 4, there is shown a first embodiment of the input buffer circuit according to the present invention, which includes an external supply voltage detecting unit 100 for outputting a signal LVCC which is high when a first voltage, which had been divided at a predetermined ratio of the external supply voltage Vcc, is less than the standard voltage, and which is low when the first voltage is greater than the standard voltage, and for outputting a signal HVCC which is high when a second voltage, which had been divided at a predetermined ratio of the external supply voltage Vcc, is less than the standard voltage, and which is low when the second voltage is greater than the standard voltage; and a buffer 200 for convening an input signal Buffer Input of TTL level into an output signal Buffer output of CMOS level, in accordance with the signals HVCC and LVCC outputted from the external supply voltage detecting unit 100.

Here, the buffer 200 includes a pull-up circuit 210 for transmitting the external supply voltage Vcc applied at one end thereof to the other end thereof, as an input signal is applied thereto; a pull-down circuit 220 for transmitting a voltage Vss of ground level at one end thereof to the other end thereof, as the input signal is applied thereto; a PMOS transistor 230 being connected between the pull-up circuit 210 and the pull-down circuit 220, and enabling/disabling the buffer 200 in accordance with a chip selection signal /CS inverted by an inverter 240; an NMOS transistor 250 having its source grounded, its drain connected to the common connecting point between the pull-down circuit 220 and the PMOS transistor 230, and its gate connected to receive the inverted chip selection signal /CS series, and allowing the output signal to be low when the buffer 200 is disabled; and inverters 260 and 270 for successively inverting the signal outputted from the drain of the NMOS transistor 250. Here, the output signal Buffer Output from the buffer 200 has a NOR gate logic value for the two input signals, namely, Buffer Input and the inverted chip selection signal /CS.

The pull-up circuit 220 includes a PMOS transistor 211 having a source to which the external supply voltage is applied, and a gate to which the input signal Buffer Input of TTL level is applied; an inverter 212 for inverting the signal LVCC from the external supply voltage detecting unit 100; a transmission gate 213 for transmitting the input signal of TTL level, as the signal LVCC is applied to one input thereof and the signal outputted from the inverter 212 is applied to the other input thereof; a PMOS transistor 214 having a source to which the external supply voltage is applied, a gate to which the signal LVCC is applied, and a drain to which the output signal of the transmission gate 213 is applied; and a PMOS transistor 215 having a source to which the external supply voltage is applied, a gate to which the output signal of the transmission gate 213 is applied, and a drain connected to the drain of the PMOS transistor 211.

The pull-down circuit 220 includes an NMOS transistor 221 having a drain connected to the drain of the PMOS transistor 230, a gate to which the input signal of TTL level is applied, and a source which is grounded; an inverter 222 for inverting the signal HVCC outputted from the external supply voltage detecting unit 100; a transmission gate 223 for transmitting the input signal of TTL level, as the signal HVCC is applied to one input thereof and the output signal of the inverter 222 is applied to the other input thereof; an NMOS transistor 224 having a drain to which the output signal of the transmission gate 223 is applied, a gate to which the signal HVCC is applied, and a source which is grounded; and an NMOS transistor 225 having a gate to which output signal of the transmission gate 223 is applied, a drain connected to the common connecting point of the respective drains of the PMOS transistor 230 and the NMOS transistor 221, and a source which is grounded.

Figure 5:
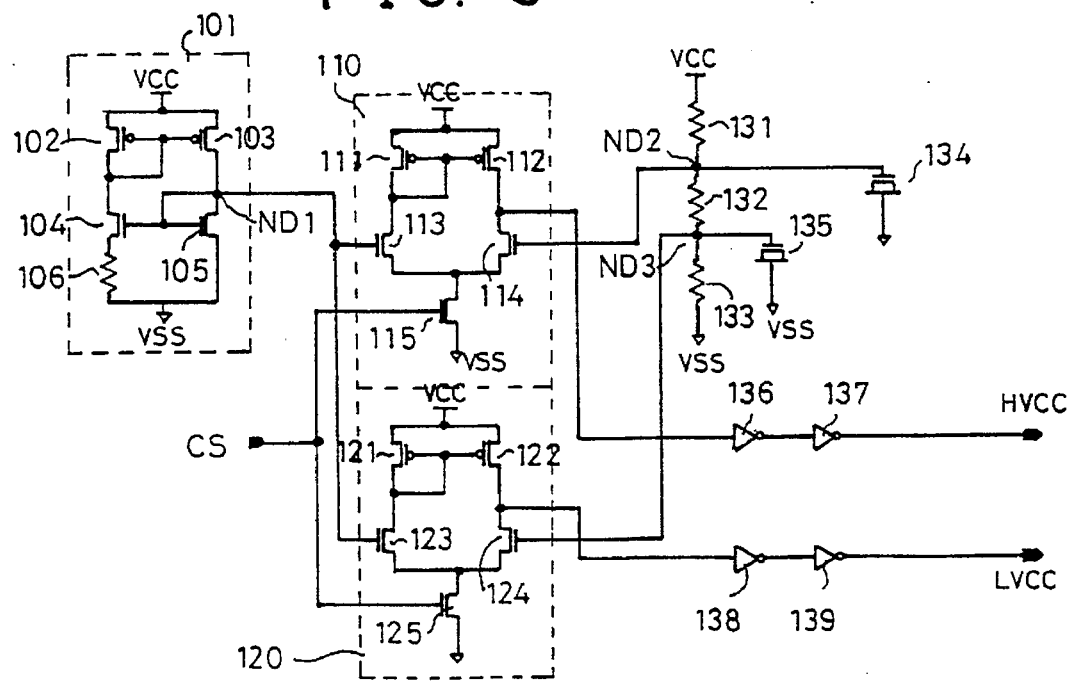
FIG. 5 schematically shows a circuit construction of an external supply voltage detecting unit in FIG. 4.

As shown in FIG. 5, the external supply voltage detecting unit 100 includes a reference voltage generator 101 for outputting a voltage of a predetermined level from a node ND1, regardless of the external supply voltage level; resistances 131 to 133 being connected in series between the external supply voltage and ground, and outputting the divided voltages from the nodes ND2 and ND3 after dividing the external supply voltage according to the ratio of their resistance values; a differential amplifier 110 for comparing the voltages inputted thereto from the nodes ND1 and ND2 and outputting the result therof; inverters 136 and 137 for successively inverting the signal outputted from the differential amplifier 110; a differential amplifier 120 for comparing the voltages inputted thereto from the nodes ND1 and ND3 and outputting the result thereof; inverters 138 and 139 for successively inverting the signal outputted from the differential amplifier 120; and capacitors 134 and 135 for stabilizing the electric potentials at the nodes ND2 and ND3, respectively. Here, the differential amplifier 110 includes four transistors 111 to 114 forming a current mirror which is enabled by the chip selection signal CS applied to the gate of an NMOS transistor 115, for comparing the voltages applied at the gates of transistors 113 and 114. Further, the differential amplifier 120 is structurally the same as the differential amplifier 110.

The operation and effect of the present invention having the above-described structure will be explained, with reference to the drawings. When a chip selection signal CS and an external supply voltage are applied to the input buffer circuit according to the present invention, the reference voltage generator 101 of the external supply voltage detecting unit 100 outputs a predetermined voltage to the node ND1, regardless of the external supply voltage. In the reference voltage generator 101, series transistors 102 and 104 and series transistors 103 and 105 are symmetrically arranged to form parallel paths. Here, the gates of the transistors 102 and 103 are connected to each other, and are further connected to the common connecting point of the drains of the transistors 102 and 104. The gates of the transistors 104 and 105 are connected to each other, and are further connected to the common connecting point of the drains of the transistors 103 and 105. Additionally, to restrict the current flowing in the transistor 104, a resistance 106 is provided between the source of transistor 104 and ground. As the reference voltage generator 101 has a symmetrical construction and the currents flowing through the two paths are the same, the node ND1 always outputs a voltage of a predetermined level. The external supply voltage is divided according to the resistance values of the resistances 131 to 133 and outputted from the nodes ND2 and ND3. Consequently, the differential amplifier 110 is enabled when the chip selection signal CS of high level is applied to the gate of NMOS transistor 115, and thereby compares the level of the voltages inputted from the nodes ND1 and ND2, and outputs the result thereof. Similarly, the differential amplifier 120 is enabled when the chip selection signal of high level is applied to the gate of NMOS transistor 125, and thereby compares the level of the voltages inputted from the nodes ND1 and ND3, and outputs the result thereof. The signal outputted from the differential amplifier 110 is successively inverted by the inverters 136 and 137, respectively, and outputted to the buffer 200 as the signal HVCC. The signal outputted from the differential amplifier 120 is successively inverted by the inverters 138 and 139, respectively, and outputted to the buffer 200 as the signal LVCC.

Figure 6:
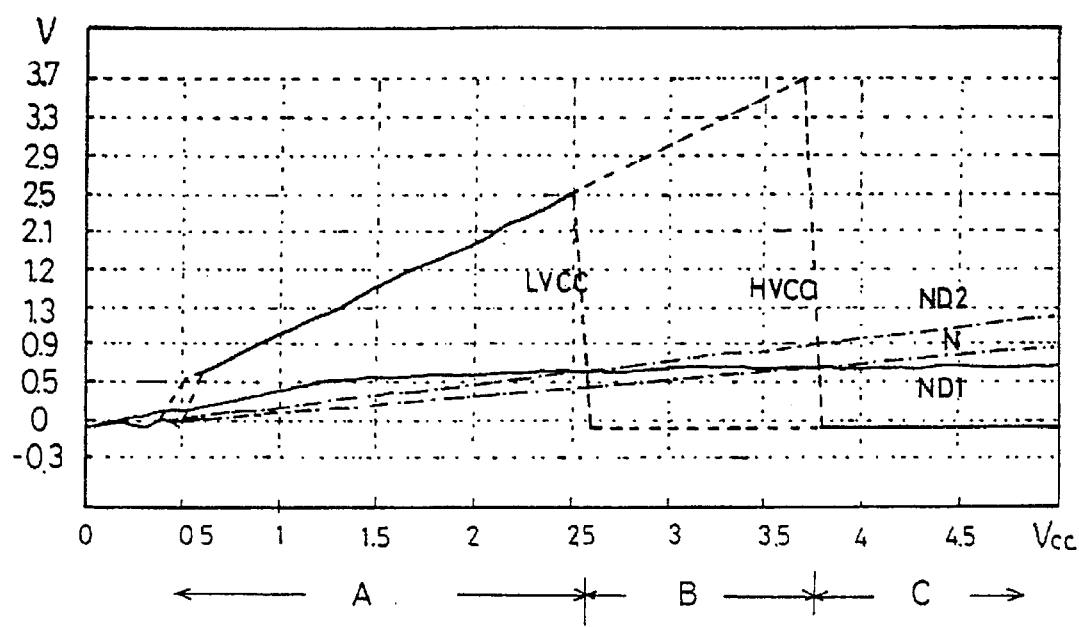
FIG. 6 is a diagram explaining the signal generated at the external supply voltage detecting unit.

The generation processes of the signals LVCC and HVCC are now explained, referring to FIG. 6. Voltage levels inputted to the differential amplifier 110 from the nodes ND1 and ND2 are indicated as ND1 and ND2 on the graph. At this time, of the two voltages inputted to the differential amplifiers 110, in regions where the level of ND2 is lower than that of ND1, a signal of high level is outputted. On the contrary, in regions where the level of ND2 is higher than that of ND1, a signal of low level is outputted. Thereafter, the signal transited to low level from high level is inverted by the inverters 136 and 137 respectively, and outputted as the signal HVCC. Similarly, voltage levels inputted to the differential amplifier 120 from the nodes ND1 and ND3 are indicated as ND1 and ND3. In regions where the level indicated as ND3 is lower than the level indicated as ND1, a signal of high level is outputted. On the contrary, in regions where the level indicated as ND3 is higher than the level indicated as ND1, a signal of low level is outputted. Thereafter, the signal transited to low level from high level is inverted by the inverters 138 and 139, successively, and outputted as the signal LVCC. Accordingly, the signals outputted from the external supply voltage detecting unit 100 are divided into three regions: a region A where the signals LVCC and HVCC are both high level; a region B where the signal LVCC is low level and the signal HVCC is high level; and a region C where the signals LVCC and HVCC are both low level.

On the other hand, in the buffer 200, when the chip selection signal CS of low level is inputted, the inverter 240 inverts this signal to a high signal, and applies it to the gates of the NMOS transistor 250 and PMOS transistor 230. At this time, since the PMOS transistor 230 is turned off, the pull-up circuit 210 and the pull-down circuit 220 are disabled. As shown above, when the pull-up circuit 210 and the pull-down circuit 220 are disabled, as the NMOS transistor 250 is turned on, the output signal Buffer Output of the buffer 200 is always low level. As described above, in the case where the pull-up circuit 210 and the pull-down circuit 220 are disabled, the buffer 200 outputs the signal of low level, regardless of the level of input signal.

Assuming that the chip selection signal of high level is inputted, the inverter 240 inverts this signal to a low level, and applies it to the gates of the NMOS transistor 250 and the PMOS transistor 230. Accordingly, since the PMOS transistor 230 is turned on, the pull-up circuit 210 and the pull-down circuit 220 are enabled, and thereby the output signal of the buffer 200 is dependent upon the level of the input signal. Further, the NMOS transistor 250 which forms an output signal of low level when the pull-up circuit 210 and the pull-down circuit 220 are disabled is turned off. The enabled pull-up circuit 210 and the pull-down circuit 220 form a circuit of a general inverter. In the region where the signals HVCC and LVCC outputted from the voltage detecting unit 100 are all high level, that is, in region A of FIG. 6 (where, Vcc is larger than or equal to 2.6 V), the transmission gate 213 is turned on and the PMOS transistor 214 is turned off in accordance with the signal LVCC. On the other hand, the transmission gate 223 is turned off and the NMOS transistor 224 is turned on in accordance with the signal HVCC. Here, the transistor 224 which is turned on allows the transistor 225 connected in parallel with the transistor 221 to be turned off. The transistor 214 which is turned off allows the transistor 215 to be connected in parallel with the transistor 211. Accordingly, the buffer 200 is actually configured equivalently to the inverter circuit shown in FIG. 7. Here, as another PMOS transistor 215 is connected in parallel with the PMOS transistor 11 of FIG. 1, the value of the current through the pull-up circuit 210 becomes relatively larger than that of the pull-up circuit which is initially set.

Additionally, in the region where the chip selection signal is high, the signal HVCC is high, and the signal LVCC is low, that is, in region B of FIG. 6 (where, Vcc is larger than 2.6 V and smaller than 3.8 V), the transmission gate 213 is turned off and the PMOS transistor 214 is turned on in accordance with the signal LVCC. And, the transmission gate 223 is turned off and the NMOS transistor 224 is turned on in accordance with the signal HVCC. Here, the transistors 214 and 224 which are turned on allow the transistors 215 and 225 connected in parallel with the transistors 211 and 221, respectivley, to be turned off. Accordingly, the buffer 200 is actually configured equivalently to the inverter circuit shown in FIG. 1, and thereby the values of the currents through the pull-up circuit 210 and the pull-down circuit 220 are similar to those of the pull-up circuit and pull-down circuit which are initially set.

On the other hand, in the region where the chip selection signal is high, and the signals HVCC and LVCC are both low, that is, in region C of FIG. 6 (where, Vcc is smaller than or equal to 3.8 V), the transmission gate 213 is turned off and the PMOS transistor 214 is turned on in accordance with the signal LVCC. And, the transmission gate 223 is turned on and the NMOS transistor 224 is turned off in accordance with the signal HVCC. Here, the transistor 214 which is turned on allows the transistor 215 connected in parallel with the transistor 211 to be turned off, and the transistor 224 which is turned off allows the transistor 225 connected in parallel with the transistor 221 to be turned on. Accordingly, the buffer 200 is actually configured equivalently to the inverter circuit shown in FIG. 8. Here, as another NMOS transistor 225 is connected in parallel with the NMOS transistor 13 of FIG. 1, thereby the value of the current through the pull-down circuit 220 becomes relatively larger than that of the pull-down circuit which is initially set.

Figure 1:
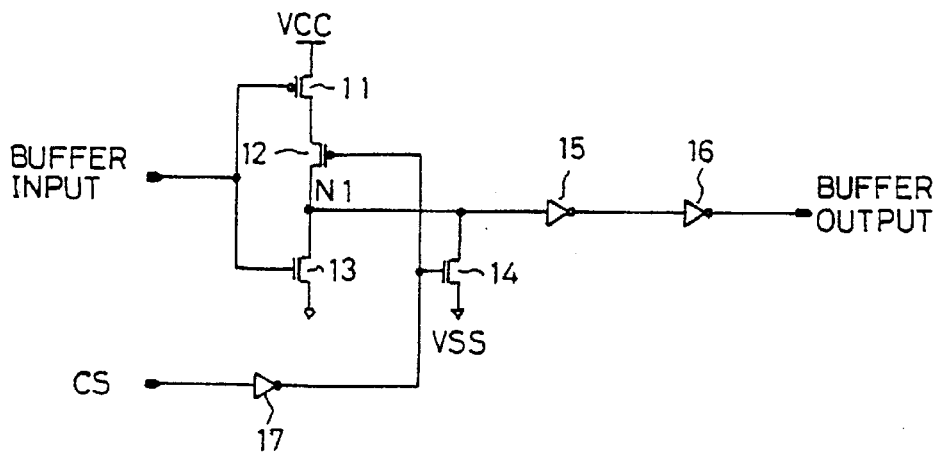
FIG. 1 is a schematic circuit diagram showing the construction of a conventional input buffer circuit.
Figure 2:
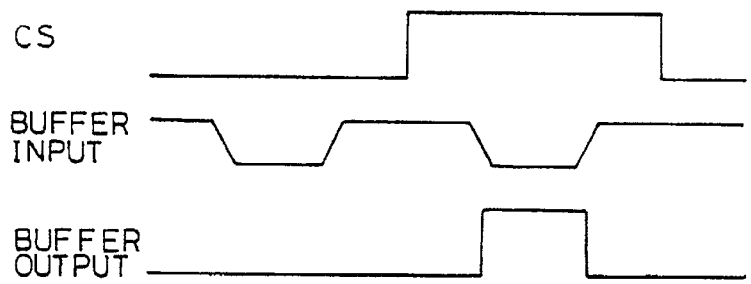
FIG. 2 is a timing diagram showing the relationships among a chip selection signal, an input signal and an output signal in the circuit of FIG. 1.
Figure 3:
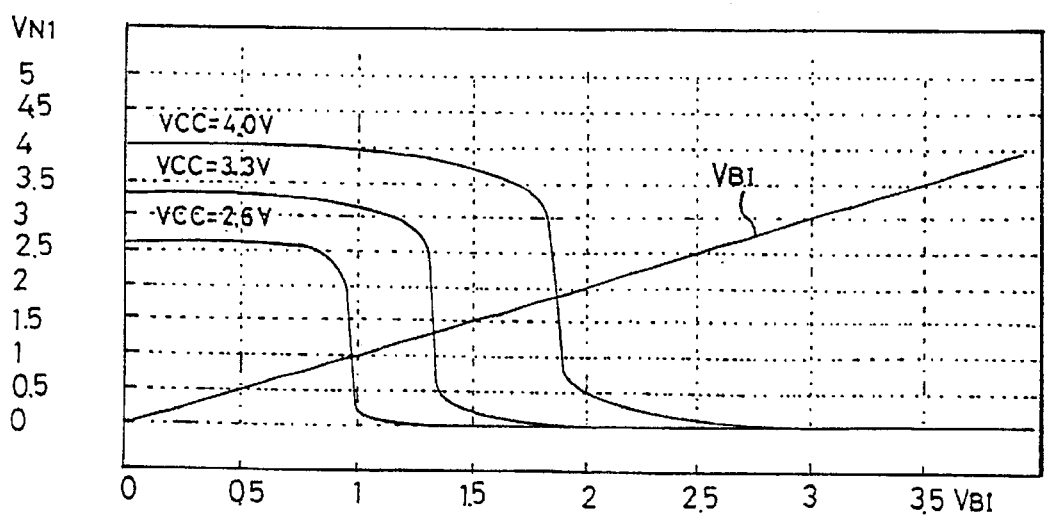
FIG. 3 is a graph showing the relationships between an external supply voltage and a logic threshold voltage in the circuit of FIG. 1.
Figure 7:
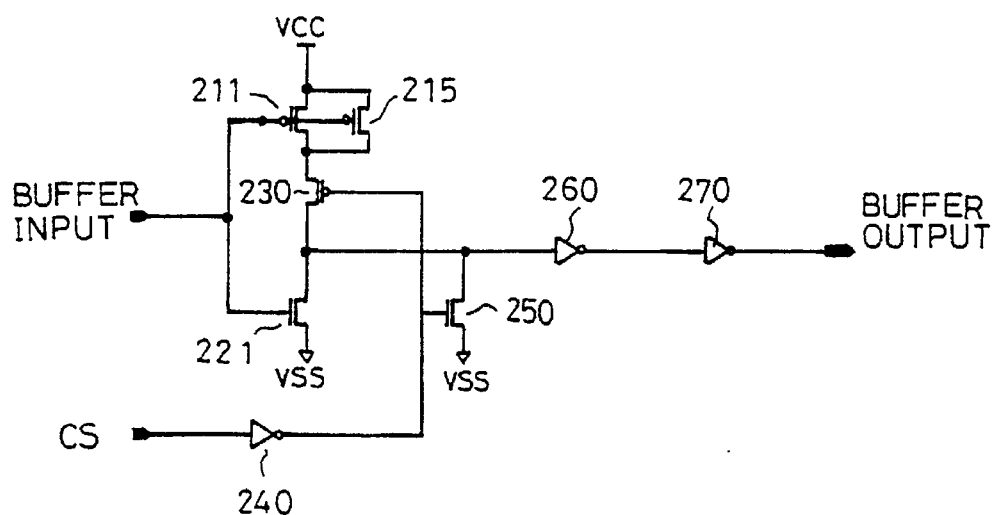
FIGS. 7 and 8 show operations of the first embodiment of the input buffer circuit according to the present invention in accordance with the signal outputted from the external supply voltage detecting unit.
Figure 8:
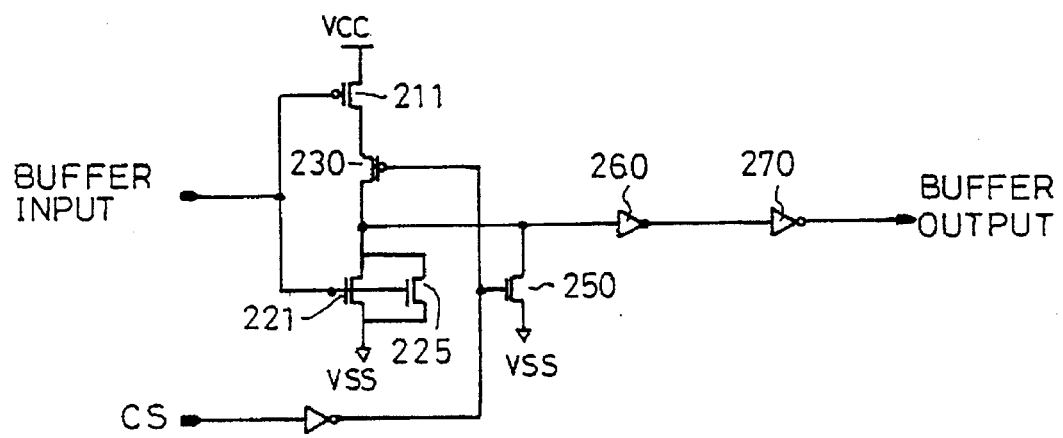
Figure 9:
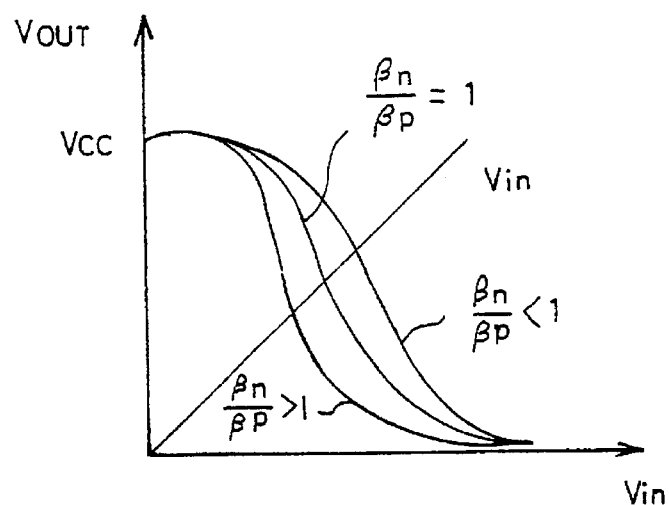
FIG. 9 is a graph showing input/output characteristics of an inverter.

As described above, when the buffer 200 is constructed as the circuit shown in FIG. 7, a logic threshold voltage is larger than in the circuit of FIG. 1. On the other hand, when the buffer 200 is constructed as the circuit shown in FIG. 8, the logic threshold voltage is lowered in comparison with the circuit of FIG. 1. Such a change of the logic threshold voltage is due to the input/output characteristic of the inverter circuit shown in FIG. 9. That is, when the external supply voltage is 5 V, in the inverter circuit shown in FIG. 1, the logic threshold voltage in the case where $\beta n$ of the NMOS transistor 13 divided by $\beta p$ of the PMOS transistor 11 is less than 1 ($\beta n/\beta p<1$), is larger than the logic thershold voltage in the case where the value $\beta n$ of the NMOS transistor 13 divided by the value $\beta p$ of the PMOS transistor 11 is equal to 1 ($\beta n/\beta p=1$). On the other hand, the logic threshold voltage in the case where $\beta n$ divided by $\beta p$ is larger than 1 ($\beta n/\beta p>1$), is lower than the logic threshold voltage in the case where $\beta n$ divided by $\beta p$ is equal to 1 ($\beta n/\beta p=1$). Here, $\beta$ is equal to $(\mu \cdot \epsilon/Tox) \cdot (W/L)$, where $\mu$ indicates the standard mobility of a charge carrier, $\epsilon$ indicates a dielectric constant of a gate oxide, and Tox indicates the thickness of the gate oxide. Further, W and L indicate the width and length of each gate. When $\mu$, $\epsilon$ and Tox are unchanged, to satisfy the formula $\beta n/\beta p<1$, W and L of the PMOS transistor should be made larger than those of the NMOS transistor. In FIG. 7, the PMOS transistors 211 and 215 are connected in parallel, and thus the above-mentioned requirement is satisfied. On the other hand, to satisfy the formula $\beta n/\beta p>1$, W and L of the NMOS transistor should be made larger than those of the PMOS transistor. In FIG. 8, the NMOS transistors 221 and 225 are connected in parallel, and thus the above-mentioned requirement is satisfied.

Figure 10:
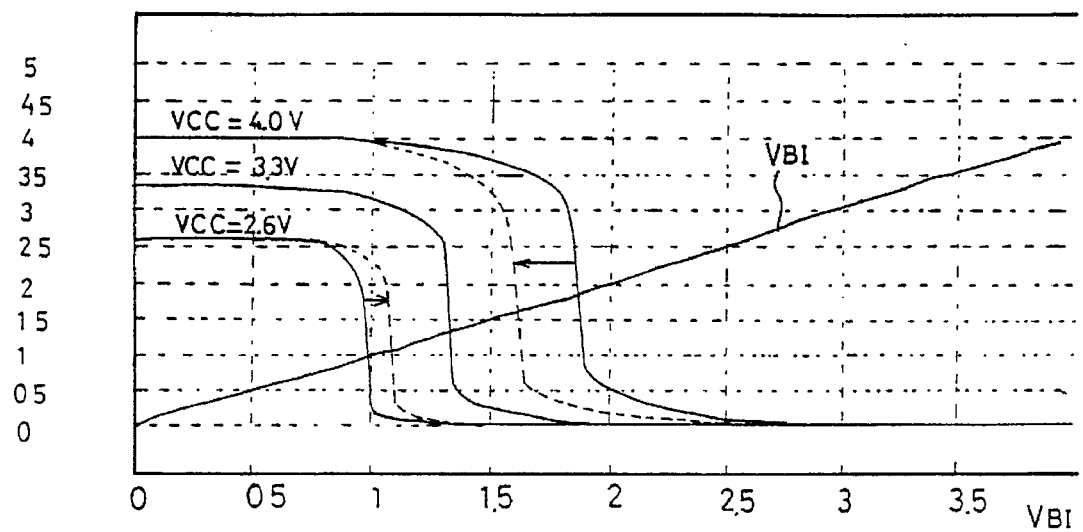
FIG. 10 is a diagram explaining the effect of the input buffer circuit according to the present invention.

Accordingly, the input/output characteristics of the input buffer circuit according to the present invention, as shown in FIG. 10, has a larger logic threshold voltage than in the conventional circuit in the case where the external supply voltage is below 2.6 V, that is, in region A of FIG. 6, as the buffer 200 of FIG. 4 is transformed as shown in FIG. 7. On the other hand, in the case where the external supply voltage is above 3.8 V, that is in region C of FIG. 6, as the buffer 200 of FIG. 4 is transformed as shown in FIG. 8, the logic threshold voltage is lower than in the conventional circuit. Further, when the external supply voltage is above 2.6 V and below 3.8 V, that is in region B of FIG. 6, the logic threshold voltage is similar to the threshold voltage of the conventional circuit.

Figure 11:
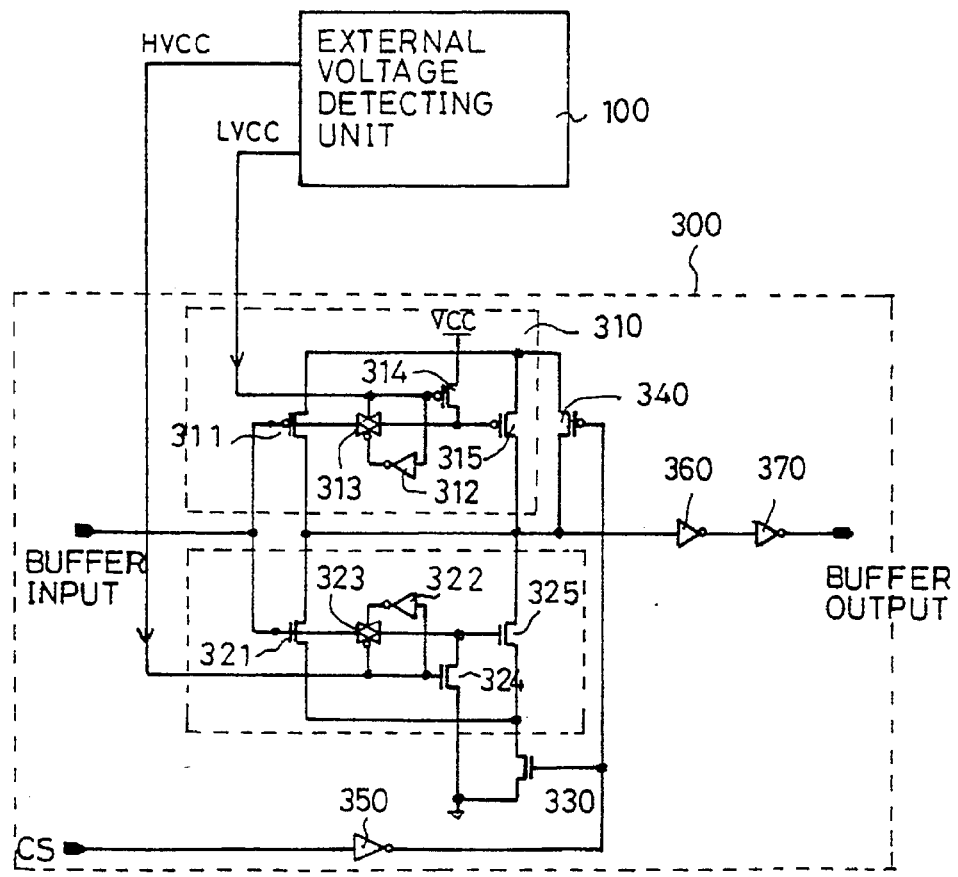
FIG. 11 is a schematic block diagram showing a second embodiment of the input buffer circuit according to the present invention.

As shown in FIG. 11, the second embodiment of the input buffer circuit according to the present invention includes an external supply voltage detecting unit 100 for generating signals HVCC and LVCC; and a buffer 300 for converting the input signal Buffer Input of TTL level into a signal Buffer Output of CMOS level in accordance with the signals HVCC and LVCC outputted from the external supply voltage detecting unit 100.

Here, the buffer 300 includes a pull-up circuit 310 for transmitting an external supply voltage applied to one end thereof to the other end thereof, as an input signal is applied thereto; a pull-down circuit 320 for transmitting a voltage of ground level at one end thereof to the other end thereof, as the input signal is applied thereof; an NMOS transistor 330 being connected between the pull-down circuit 320 and ground, for enabling/disabling the buffer 300 in accordance with a chip selection signal /CS inverted by an inverter 350; a PMOS transistor 340 having a source connected to the external supply voltage, a drain connected to the common connecting point between the pull-up circuit 310 and the pull-down circuit 320, and a gate to which the chip selection signal /CS inverted by the inverter 350 is applied, for allowing the output signal to be a high level when the buffer 300 is disabled; and series inverters 360 and 370 for successively inverting the signal outputted from the PMOS transistor 340. Here, the output signal Buffer Output of the buffer 300 has a NAND gate logic value for the two input signals, i.e., Buffer Input and the inverted chip selection signal /CS.

The pull-up circuit 310 includes a PMOS transistor 311 having a source to which the external supply voltage is applied, and a gate to which the input signal of TTL level is applied; an inverter 312 for inverting the signal LVCC from the external supply voltage detecting unit 100; a transmission gate 313 for transmitting the input signal of TTL level, as the signal LVCC is applied to one input thereof and the output signal of the inverter 312 is applied to the other input thereof; a PMOS transistor 314 having a source to which the external supply voltage is applied, a gate to which the signal LVCC is applied, and a drain to which the signal outputted from the transmission gate 313 is applied; and a PMOS transistor 315 having a source to which the external supply voltage is applied, a gate to which the signal outputted from the transmission gate 313 is applied, and a drain connected to the drain of the PMOS transistor 311.

The pull-down circuit 320 includes an NMOS transistor 321 having a drain connected to the drain of the PMOS transistor 311, a gate to which the input signal of TTL level is applied, and a source connected to the drain of the NMOS transistor 330; an inverter 322 for inverting the signal HVCC outputted from the external supply voltage detecting unit 100; a transmission gate 323 for transmitting the input signal of TTL level, as the signal HVCC is applied to one input thereof and the output signal of the inverter 322 is applied to the other input thereof; an NMOS transistor 324 having a drain to which the output signal of the transmission gate 323 is applied, a gate to which the signal HVCC is applied and a source which is grounded; and an NMOS transistor 325 having a gate to which the output signal of the transmission gate 323 is applied, and a drain and a source connected to the drain and source of the NMOS transistor 321, respectively.

When the chip selection signal CS of high level is inputted to the buffer 300 having the above-described structure, the inverter 315 inverts the signal to a low level and applies it to the gates of the transistors 330 and 340. At this time, the transistor 330 is turned off and the pull-up circuit 310 and the pull-down circuit 320 are disabled. On the other hand, as the transistor 340 is turned on, the output signal Buffer Output of the buffer 300 is always high.

Figure 12:
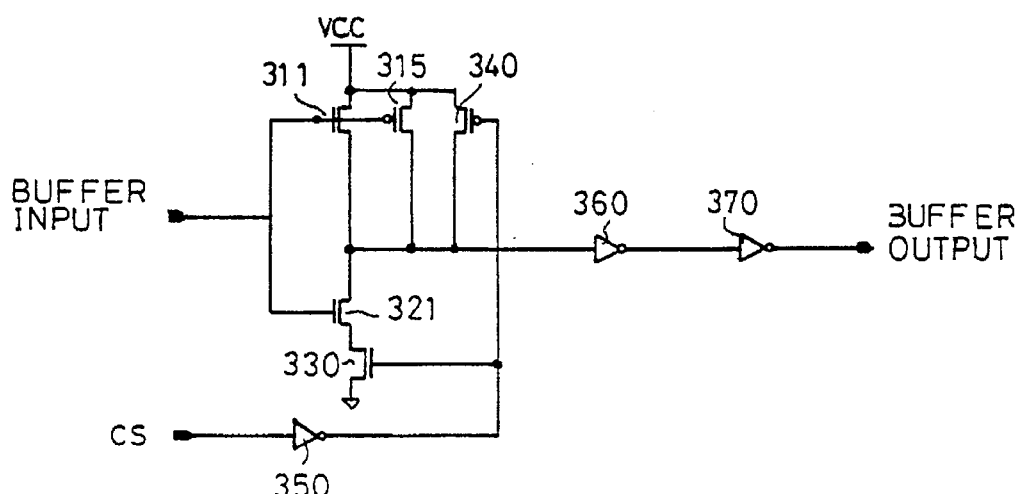
FIGS. 12 through 14 are diagrams explaining the operations of the second embodiment of the input buffer circuit according to the present invention in accordance with the signal outputted from the external supply voltage detecting unit.

However, when the chip selection signal CS of low level is inputted, the inverter 315 inverts the signal to a high level and applies it to the gates of transistors 306 and 312. At this time, as the transistor 340 is turned off and the transistor 330 is turned on, the signal outputted from the buffer 300 is dependent upon the state of the input signal. In this case, when the level of the external supply voltage within the region A of FIG. 6, the external supply voltage detecting unit 100 outputs the signals HVCC and LVCC both of high level. The transmission gate 313 is turned on and the transistor 314 is turned off in accordance with the signal LVCC of high level. Further, the transmission gate 323 is turned off and the transistor 324 is turned on in accordance with the signal HVCC of high level. Here, the transistor 324 which is turned on allows the transistor 325 connected in parallel with the transistor 321 to be turned off, and the transistor 314 which is turned off allows the transistor 315 to be connected in parallel with the transistor 311. Accordingly, at this time, as the circuit is configured equivalently to the circuit shown in FIG. 12, the value of the current through the pull-up circuit 310 is relatively larger than that through the pull-up circuit which is initially set.

Figure 13:
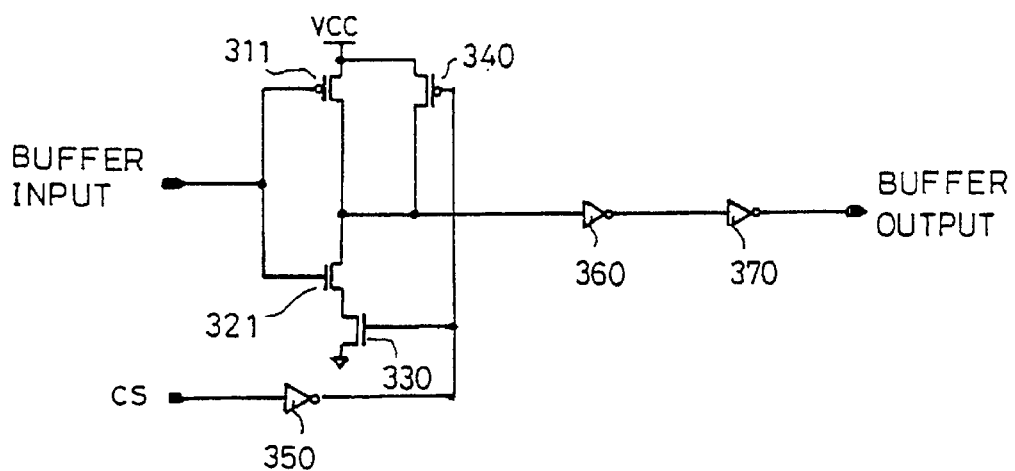

In the case that the external supply voltage level is within the region B of FIG. 6, the external supply voltage detecting unit 100 outputs the signal HVCC of high level and the signal LVCC of low level. The transmission gate 313 is turned off and the transistor 314 is turned on in accordance with the signal LVCC of low level, and the transmission gate 323 is turned off and the transistor 324 is turned on in accordance with the signal HVCC of high level. Accordingly, as the circuit at this time is configured equivalently to the circuit shown in FIG. 13, the values of the pull-up circuit 310 and the pull-down circuit 320 are the same as in the pull-up circuit and the pull-down circuit as initially set. At this time, the transistors 314 and 324 allow the transistors 315 and 325 which are respectively connected in parallel with the transistors 311 and 321 to be turned off.

Figure 14:
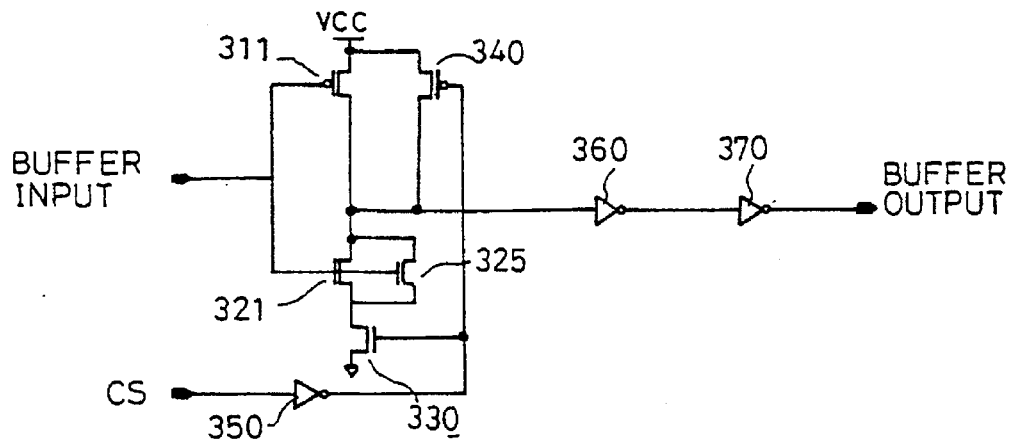

On the other hand, in the case that the external supply voltage level is within the region C of FIG. 6, the external supply voltage detecting unit 100 outputs the signals HVCC and LVCC both of low level. At this time, the transmission gate 313 is turned off and the transistor 314 is turned on in accordance with the signal LVCC of low level, and the transmission gate 323 is turned on and the transistor 324 is turned off in accordance with the signal HVCC of low level. Accordingly, as the circuit at this time is configured equivalently to the circuit shown in FIG. 14, the value of the current through pull-down circuit 320 is relatively larger than that through the pull-down circuit as initially set. At this time, the transistor 314 which is turned on allows the transistor 315 connected in parallel with the transistor 311 to be turned off, and the transistor 324 which is turned off allows the transistor 325 to be connected in parallel with the transistor 321.

The operation of the input buffer 300 in the second embodiment according to the present invention is basically the same as the operation of the input buffer 200 in the first embodiment of the present invention, and thus detailed descriptions thereof are omitted.

As described above, the input buffer circuit according to the present invention has an advantage in that the operating margins for a logical high input range and logical low input range are improved when converting voltages of TTL level into voltages of CMOS level, by controlling the logic threshold voltage so as to lower the logic threshold voltage when external supply voltage level is high and raise the logic threshold voltage when the external supply voltage level is low.

What is claimed is:

1. An input buffer circuit comprising:
   an external supply voltage detecting means for dividing the level of the external supply voltage into a plurality of regions by comparing a plurality of divided voltages which have been divided by different ratios with the external supply voltage, with a standard voltage level; and
   converting means including a pull-up means and a pull-down means, for converting input signals of TTL level into signals of CMOS level, according to the regions of the external supply voltage obtained by said external supply voltage detecting means.

2. The circuit of claim 1, wherein said pull-up means and pull-down means each include an inverter, respectively.

3. The circuit of claim 2, wherein said inverter additionally includes an enable means for enabling the inverter in accordance with a chip selection signal.

4. The circuit of claim 3, wherein, in said inverter, a means for outputting a signal of a predetermined level is additionally included, when said inverter is disabled.

5. The circuit of claim 4, wherein said signal of predetermined level is of a low logic level.

6. The circuit of claim 4, wherein said signal of predetermined level is of a high logic level.

7. The circuit of claim 2, wherein said inverter reduces a logic threshold voltage of the circuit when a signal inputted from said external supply voltage detecting means is in a lowest region of said plurality of regions.

8. The circuit of claim 7, wherein the reduction of said logic threshold voltage is achieved by increasing the value of a current through the pull-up means.

9. The circuit of claim 8, wherein the increase in the value of the current through said pull-up means is achieved by additionally connecting at least one transistor in parallel with said pull-up means.

10. The circuit of claim 9, wherein, in said at least one transistor, its gate is a transmission gate which is turned on and connected to a gate of said pull-up means.

11. The circuit of claim 10, wherein said transmission gate is turned off when a signal inputted thereto from said external supply voltage detecting means is not in the lowest region.

12. The circuit of claim 2, wherein said inverter maintains unchanged a logic threshold voltage of the circuit when a signal inputted from said external supply voltage detecting means is in a middle region of said plurality of regions.

13. The circuit of claim 2, wherein said inverter increases a logic threshold voltage of the circuit when a signal inputted from said external supply voltage detecting means is in a highest region of said plurality of regions.

14. The circuit of claim 13, wherein the increase of said logic threshold voltage is achieved by increasing the value of a current through the pull-down means.

15. The circuit of claim 14, wherein the increase in value of the current through said pull-down means is achieved by additionally connecting at least one transistor in parallel with said pull-down means.

16. The circuit of claim 15, wherein, in said at least one transistor, its gate is a transmission gate which is turned on and connected to a gate of said pull-down means.

17. The circuit of claim 16, wherein said transmission gate is turned off when a signal inputted thereto from said external supply voltage detecting means is not in the highest region.

* * * * *